(12) United States Patent
Chen et al.

(10) Patent No.: US 11,698,667 B2
(45) Date of Patent: Jul. 11, 2023

(54) DISPLAY PANEL AND FLEXIBLE DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Liqiang Chen, Beijing (CN); Xiangfei He, Beijing (CN); Weifeng Zhou, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 280 days.

(21) Appl. No.: 17/256,093

(22) PCT Filed: Jun. 12, 2020

(86) PCT No.: PCT/CN2020/095703
§ 371 (c)(1),
(2) Date: Dec. 24, 2020

(87) PCT Pub. No.: WO2020/249058
PCT Pub. Date: Dec. 17, 2020

(65) Prior Publication Data
US 2021/0271298 A1    Sep. 2, 2021

(30) Foreign Application Priority Data

Jun. 13, 2019 (CN) .......................... 201920888706.4

(51) Int. Cl.
*G06F 1/18* (2006.01)
*G06F 1/16* (2006.01)
(Continued)

(52) U.S. Cl.
CPC ............ *G06F 1/189* (2013.01); *G06F 1/1652* (2013.01); *G06F 1/1656* (2013.01);
(Continued)

(58) Field of Classification Search
None
See application file for complete search history.

(56) References Cited

U.S. PATENT DOCUMENTS 9,318,427 B2    4/2016  Youn et al.
9,600,112 B2    3/2017  Zhang et al.
(Continued)

FOREIGN PATENT DOCUMENTS

CN    104769719 A    7/2015
CN    104979316 A    10/2015
(Continued)

*Primary Examiner* — Duane N Taylor, Jr.
(74) *Attorney, Agent, or Firm* — Houtteman Law LLC

(57) ABSTRACT

The present disclosure provides a display panel including: a panel main body including a display region, a bendable region and a binding region, wherein a plurality of signal transmission lines extending from the display region to the binding region are arranged in the bendable region; and an enhancement layer in the bendable region of the panel main body and including an electrode layer, wherein the electrode layer includes at least one auxiliary electrode, each auxiliary electrode corresponds to one of the plurality of signal transmission lines, different auxiliary electrodes correspond to different ones of the plurality of signal transmission lines, respectively, and each auxiliary electrode is electrically connected to a corresponding signal transmission line. The present disclosure further provides a flexible display device.

19 Claims, 7 Drawing Sheets

(51) Int. Cl.
*G06F 3/044* (2006.01)
*H10K 59/131* (2023.01)

(52) U.S. Cl.
CPC ....... *G06F 3/0443* (2019.05); *H10K 59/1315* (2023.02); *G06F 2203/04102* (2013.01)

(56) References Cited

U.S. PATENT DOCUMENTS

| | | |
|---|---|---|
| 9,601,557 B2 | 3/2017 | Yang et al. |
| 9,974,175 B2 | 5/2018 | Bae et al. |
| 10,134,678 B2 | 11/2018 | Li et al. |
| 2016/0103534 A1 | 4/2016 | Zhang et al. |
| 2017/0188449 A1 | 6/2017 | Nakagawa et al. |
| 2019/0101785 A1* | 4/2019 | Araki .................. H01L 51/0096 |
| 2019/0139481 A1 | 5/2019 | Zhang et al. |

FOREIGN PATENT DOCUMENTS

| | | |
|---|---|---|
| CN | 105144270 A | 12/2015 |
| CN | 105551378 A | 5/2016 |
| CN | 107079579 A | 8/2017 |
| CN | 108470727 A | 8/2018 |
| CN | 209912403 A | 1/2020 |
| WO | WO2018077257 A | 5/2018 |
| WO | WO-2020204214 A1 * | 10/2020 |

\* cited by examiner

DISPLAY PANEL AND FLEXIBLE DISPLAY DEVICE

CROSS REFERENCE TO RELATED APPLICATIONS

This is a National Phase Application filed under 35 U.S.C. 371 as a national stage PCT/CN2020/095703 filed on Jun. 12, 2020, an application claiming the priority of Chinese patent application No. 201920888706.4, filed on Jun. 13, 2019, the content of each of which is incorporated herein by reference in its entirety.

TECHNICAL FIELD

The present disclosure relates to the field of display technologies, and in particular, to a display panel and a flexible display device.

BACKGROUND

At present, a narrow border design of a flexible display panel is generally implemented by a pad bonding technology. Specifically, the pad bonding technology may refer to designing a bendable region between a bonding region and a display region of a display panel, and bending the bendable region of the display panel toward a back side (i.e., a side opposite to a light-emitting side) of the display region of the display panel such that the bonding region is located at the back side of the display region of the display panel, thereby reducing a width of a border of display panel.

SUMMARY

Embodiments of the present disclosure provide a display panel and a flexible display device.

A first aspect of the present disclosure provides a display panel including: a panel main body including a display region, a bendable region and a binding region, wherein a plurality of signal transmission lines extending from the display region to the binding region are arranged in the bendable region; and an enhancement layer in the bendable region of the panel main body and including an electrode layer, wherein the electrode layer includes at least one auxiliary electrode, each auxiliary electrode corresponds to one of the plurality of signal transmission lines, different auxiliary electrodes correspond to different ones of the plurality of signal transmission lines, respectively, and each auxiliary electrode is electrically connected to a corresponding signal transmission line.

In an embodiment, each auxiliary electrode is connected to the corresponding signal transmission line through an anisotropic conductive adhesive to form parallel conductive channels.

In an embodiment, the enhancement layer further includes a flexible substrate on a side of the electrode layer distal to the panel main body.

In an embodiment, a number of the at least one auxiliary electrode is equal to a number of the plurality of signal transmission lines, and all of auxiliary electrodes are arranged in a first direction.

In an embodiment, the enhancement layer is on a side of the plurality of signal transmission lines distal to the panel main body;

For any one auxiliary electrode of the auxiliary electrodes, a length-direction virtual extension line of the any one auxiliary electrode intersects with a length-direction virtual extension line of at least one other auxiliary electrode.

For any one signal transmission line of the plurality of signal transmission lines, a length-direction virtual extension line of the any one signal transmission line intersects with a length-direction virtual extension line of at least one other signal transmission line.

The length-direction virtual extension line of the any one auxiliary electrode coincides with the length-direction virtual extension line of the signal transmission line corresponding to the any one auxiliary electrode.

In an embodiment, length-direction virtual extension lines of the auxiliary electrodes intersect at a same convergence point on a reference line perpendicular to the first direction.

Among all of the auxiliary electrodes, the farther the auxiliary electrode is from the reference line, the greater an angle between the length-direction virtual extension line of the auxiliary electrode and the reference line.

Length-direction virtual extension lines of the plurality of signal transmission lines intersect at a same convergence point on the reference line.

Among all of the plurality of signal transmission lines, the farther the signal transmission line is from the reference line, the greater an angle between the length-direction virtual extension line of the signal transmission line and the reference line.

In an embodiment, the auxiliary electrodes have a same width in the first direction.

Maximal distances of every adjacent two of the auxiliary electrodes are gradually increased in a direction along the first direction and away from the reference line.

In an embodiment, every adjacent two of the plurality of signal transmission lines have a same maximal distance therebetween in the first direction.

Widths of the plurality of signal transmission line are gradually increased in a direction along the first direction and away from the reference line.

In an embodiment, the auxiliary electrodes have a same width in the first direction.

Maximal distances of every adjacent two of the auxiliary electrodes therebetween are gradually increased in a direction along the first direction and away from the reference line.

In an embodiment, the convergence point of the length-direction virtual extension lines of the plurality of signal transmission lines and the convergence point of the length-direction virtual extension lines of the auxiliary electrodes coincide with each other in a stacking direction of the enhancement layer and the plurality of signal transmission lines.

In an embodiment, in the first direction, the width of each auxiliary electrode is smaller than the width of the signal transmission line corresponding to the auxiliary electrode.

In an embodiment, the auxiliary electrodes are symmetrically distributed with respect to the reference line.

The plurality of signal transmission lines are symmetrically distributed with respect to the reference line.

In an embodiment, a material of each of the auxiliary electrodes includes a metal.

In an embodiment, each of the auxiliary electrodes is a single layer of molybdenum (Mo), a single layer of silver (Ag), a multilayer structure of Mo\aluminum (Al)\Mo, or a multilayer structure of titanium (Ti)\Al\Ti.

In an embodiment, the panel main body includes a base substrate and a display function layer, and the display function layer is between the base substrate and the enhancement layer.

In an embodiment, the display function layer includes a water-oxygen barrier layer, a gate insulating layer, and an interlayer insulating layer which are arranged on the substrate in sequence, and a material of each of the water-oxygen barrier layer, the gate insulating layer, and the interlayer insulating layer includes an inorganic material.

In an embodiment, the inorganic material of each of the water-oxygen barrier layer, the gate insulating layer, and the interlayer insulating layer of the display function layer in the bendable region is removed to form a groove, and the groove is filled with an organic material.

In an embodiment, the inorganic material includes silicon nitride or silicon oxide, and the organic material includes photosensitive polyimide.

In an embodiment, a material of the flexible substrate of the enhancement layer includes polyimide.

A second aspect of the present disclosure provides a flexible display device, which includes the display panel according to any one of the embodiments of the first aspect of the present disclosure.

DETAILED DESCRIPTION

To enable one of ordinary skill in the art to better understand technical solutions of the present disclosure, a display panel and a flexible display device provided by the present disclosure will be described in detail below with reference to the accompanying drawings.

The inventors of the present inventive concept have found that, in practical applications, when a bendable region of a flexible display panel is bent, a signal trace (i.e., signal line) located in the bendable region is easily broken, which causes a signal channel to be disconnected, thereby degrading a display effect.

Figure 1:
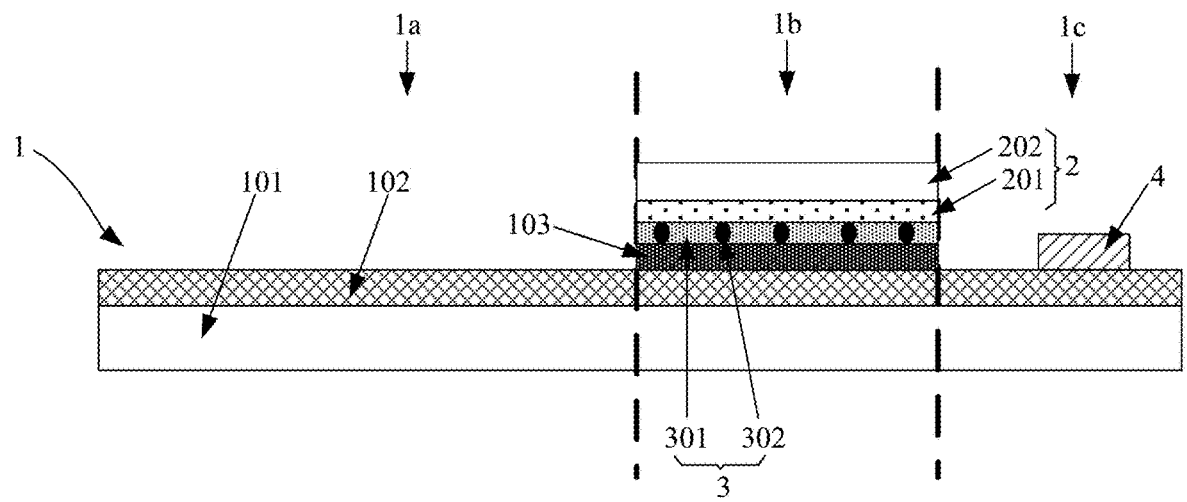
FIG. 1 is a schematic cross-sectional view of a display panel according to an embodiment of the present disclosure.
Figure 2:
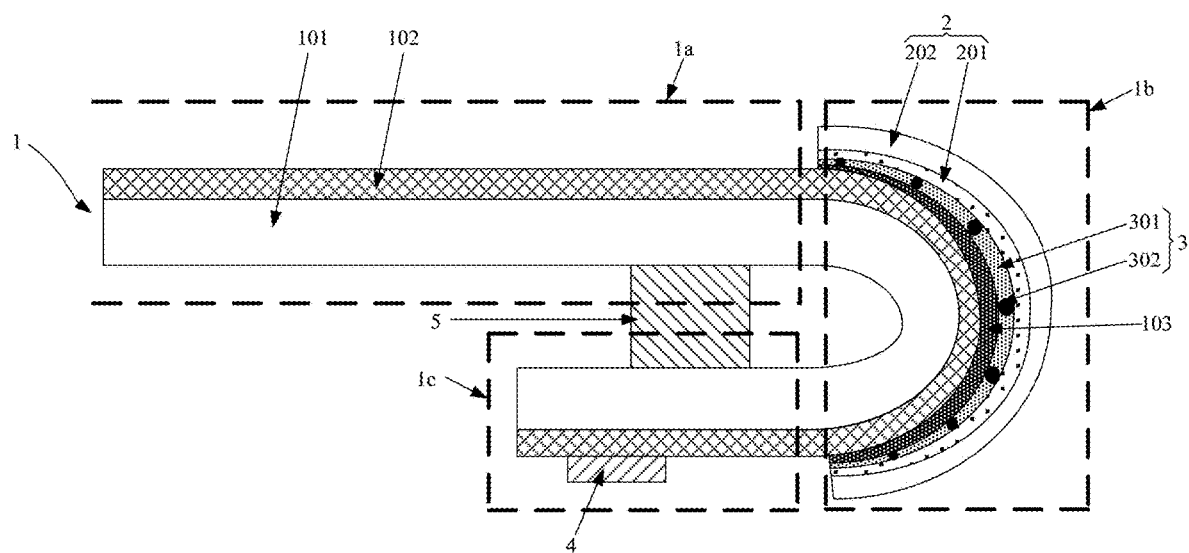
FIG. 2 is a schematic cross-sectional view of a display panel in a bent state according to an embodiment of the present disclosure.

FIG. 1 is a schematic cross-sectional view of a display panel according to an embodiment of the present disclosure, and FIG. 2 is a schematic cross-sectional view of a bendable region 1b of the display panel shown in FIG. 1 in a bent state. As shown in FIGS. 1 and 2, the display panel includes a panel main body 1. The panel main body 1 according to the present disclosure may be a conventional Organic Light-Emitting Diode (OLED) display panel.

The panel main body 1 may include a display region 1a (only a partial region of the display region 1a is schematically shown in the drawings), a bendable region 1b, and a binding region 1c. For example, a pixel circuit array (including a plurality of pixel circuits) and an OLED array (including a plurality of OLEDs) located on a side of the pixel circuit array distal to a base substrate (e.g., flexible substrate) 101 are disposed in the display region 1a. The plurality of pixel circuits may be in one-to-one correspondence with the plurality of OLEDs, and the plurality of pixel circuits may drive the plurality of OLEDs to display. In the bendable region 1b, a plurality of signal transmission lines 103 extending from the display region 1a to the bonding region 1c are disposed, one end of each signal transmission line 103 is connected to a pad 4 in the bonding region 1c, and the other end of the signal transmission line 103 is connected to a signal line (e.g., a data line, not shown) in the display region 1a, such that each signal transmission line 103 may serve as a signal channel. For convenience of description, layers constituting the pixel circuit array and the OLED array of the panel main body 1 are collectively referred to as a display function layer 102.

To prevent at least a portion of the plurality of signal transmission lines 103 in the bendable region 1b from breaking during bending to result in defects, in the present disclosure, an enhancement layer 2 is provided corresponding to (e.g., in) the bendable region 1b of the panel main body 1, and the enhancement layer 2 includes an electrode layer. The electrode layer includes: at least one auxiliary electrode (or conductive electrode) 201, each auxiliary electrode 201 corresponds to one of the signal transmission lines 103, different auxiliary electrodes 201 correspond to different signal transmission lines 103 (e.g., auxiliary electrodes 201 may be in one-to-one correspondence with the plurality of signal transmission lines 103), and each auxiliary electrode 201 and its corresponding signal transmission line 103 form an electrical connection.

In the present disclosure, when the bendable region 1b of the display panel is in an unbent state, each auxiliary electrode 201 and the corresponding signal transmission line 103 form a parallel conductive channel (which will be further described below), and at this time, each auxiliary electrode 201 and the corresponding signal transmission line 103 may form at least one conductive channel pair (including two conductive channels). For any conductive channel pair, in a subsequent process of bending the bendable region 1b, if one conductive channel of the conductive channel pair is broken, the other conductive channel thereof can still normally transmit signals, therefore the display panel can still normally display, thereby improving the bending reliability of the display panel. It should be noted that a signal transmission abnormality may occur only when both of the conductive channels of each conductive channel pair are disconnected.

As a specific example, it is assumed that each auxiliary electrode 201 and the corresponding signal transmission line 103 form two conductive channels when the bendable region 1b is in the unbent state. In a subsequent process of bending the bendable region 1b, if one of the two conductive channels is disconnected (or broken) and the other of the two conductive channels is not disconnected, the display panel can still normally display, and at this time, the auxiliary electrode 201 and the corresponding signal transmission line 103 form a combination of a series-connected structure and a parallel-connected structure. In a subsequent process of bending the bendable region 1b, if both of the two conductive channels are not disconnected, the display panel can display normally, and at this time, the auxiliary electrode 201 and the corresponding signal transmission line 103 form a parallel-connected structure. Therefore, the description in the present disclosure that "each auxiliary electrode 201 and the corresponding signal transmission line 103 are electrically connected (or form an electrical connection)" includes both the case where the auxiliary electrode 201 and the corresponding signal transmission line 103 are connected in series and the case where the auxiliary electrode 201 and the corresponding signal transmission line 103 are connected in parallel.

It should be noted that, after the bonding region 1c of the panel main body 1 is bent to the back side of the display region of the panel main body 1, a foam (i.e., foamed material) 5 may be provided to fix the bonding region 1c and the back side of the panel main body 1 together, as shown in FIG. 2.

In some embodiments, a material of each auxiliary electrode 201 includes a material of metal, and each auxiliary electrode 201 may have a single layer (e.g., of Mo or Ag) or a multilayer (e.g., Mo\Al\Mo, or Ti\Al\Ti). It should be noted that, a material and a structure of each auxiliary electrode 201 in the technical solution of the present disclosure is not particularly limited.

In the present disclosure, the enhancement layer 2 may be formed as follows. Firstly, a flexible substrate 202 is provided as a mother board, and then one or more conductive material films are formed on a side of the flexible substrate 202 as the mother board by a magnetron sputtering process, a coating process, or the like. Next, the one or more conductive material films are patterned by a patterning process to form a plurality of auxiliary electrodes 201, and finally the flexible substrate 202 as the mother board is cut to obtain a plurality of enhancement layers 2. It should be noted that the "patterning process" in the present disclosure generally includes processes such as photoresist coating, exposure, development, etching, and photoresist stripping.

The display panel provided by the present disclosure may be manufactured by the following method. Firstly, a panel main body 1 may be formed by an existing flexible OLED display panel process, an enhancement layer 2 is formed by the process for manufacturing the enhancement layer 2 as described above. Then, the enhancement layer 2 is fixed to the bendable region 1b of the panel main body by using, for example, an anisotropic conductive adhesive 3 to be further described below, such that each of the auxiliary electrodes 201 of the enhancement layer 2 and the corresponding signal transmission line 103 form parallel conductive channels.

Figure 8:
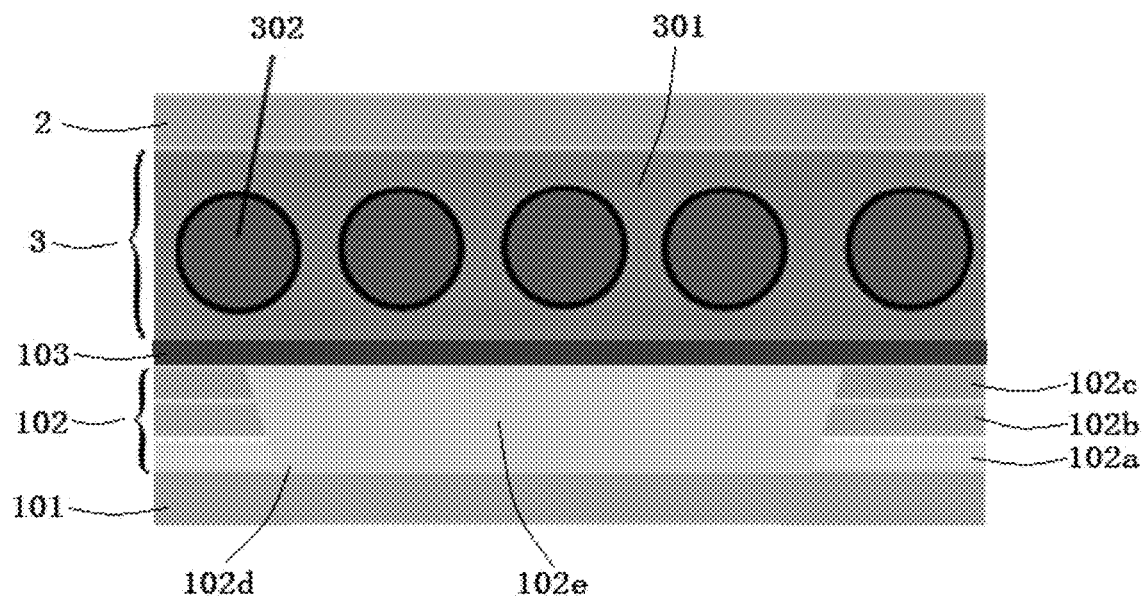
FIG. 8 is a schematic diagram illustrating that portions, which are in a bendable region, of inorganic material layers in a panel main body of a display panel are replaced by organic material layers, according to an embodiment of the present disclosure.

It should be noted that, in the process for manufacturing the panel main body 1, considering that inorganic film layers of the panel main body 1 such as silicon nitride and/or silicon oxide are very prone to breakage during bending, portions, which are in the bendable region 1b, of the inorganic film layers of the display function layer 102 are removed to form a groove, and then the groove is filled with an organic film layer (e.g., is filled with a photosensitive polyimide material, which will be further described below with reference to FIG. 8) to realize planarization and improve the bendability and reliability of the display panel.

In addition, in the present disclosure, a thickness of the flexible substrate 202 in the enhancement layer 2 may be adjusted according to a stacked structure in the bendable region 1b of the display panel, such that a stress at the position of the signal transmission lines 103 and/or the auxiliary electrodes 201 is as small as possible during a bending process (e.g., the stress is zero, and in this case a layer where the signal transmission lines 103 and/or the auxiliary electrodes 201 are located is a stress neutral layer), thereby preventing the signal transmission lines 103 and/or the auxiliary electrodes 201 from being broken, and further improving the reliability of bending of the display panel. For example, if the base substrate 101 and the organic film layer in the bendable region 1b of the display panel have a large thickness, a thickness of the flexible substrate 202 of the enhancement layer 2 may be increased appropriately.

Referring again to FIGS. 1 and 2, as an alternative embodiment of the present disclosure, each auxiliary electrode 201 and the corresponding signal transmission line 103 may form parallel conductive channels by being connected to each other via an anisotropic conductive adhesive (ACA) 3.

Figure 3:
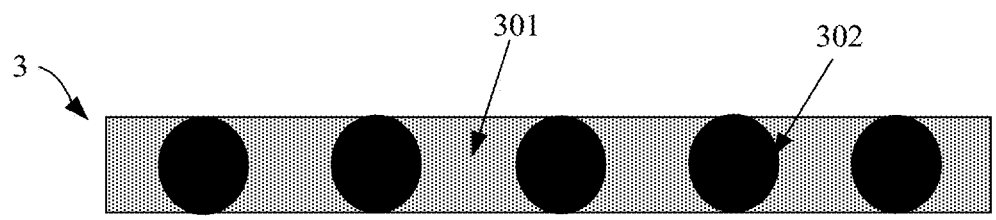
FIG. 3 is a schematic cross-sectional view of an anisotropic conductive adhesive in a display panel according to an embodiment of the present disclosure.

FIG. 3 is a schematic cross-sectional view of an anisotropic conductive adhesive 3 in a display panel according to an embodiment of the present disclosure. As shown in FIG. 3, the anisotropic conductive paste 3 generally has a sheet-like structure, and includes a colloid (e.g., an insulating resin) 301 and conductive particles (e.g., gold particles, silver particles, copper particles, aluminum particles, etc.) 302 mixed in the colloid 301. At high temperature and high pressure, portions of the insulating colloid 301 at the upper and lower surfaces of each of the conductive particles 302 are broken, thereby achieving electrical conduction in a vertical direction (e.g., a direction perpendicular to the panel main body 1 in FIG. 1 or a vertical direction in FIG. 3) and electrical insulation in a horizontal direction (e.g., a direction parallel to the upper surface of the panel main body 1 in FIG. 1 or a horizontal direction in FIG. 3).

Figure 4:
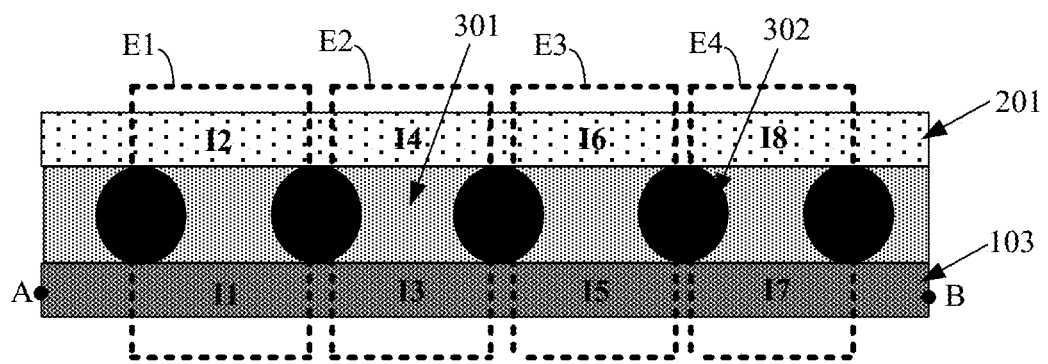
FIG. 4 is a schematic cross-sectional view illustrating parallel conductive channels formed by an auxiliary electrode and a corresponding signal transmission line connected to each other via an anisotropic conductive adhesive in a display panel according to an embodiment of the present disclosure.

FIG. 4 is a schematic cross-sectional view showing that each auxiliary electrode 201 is connected to the corresponding signal transmission line 103 via the anisotropic conductive adhesive 3 to form parallel conductive channels. As shown in FIG. 4, the auxiliary electrode 201 is connected to the corresponding signal transmission line 103 via the ACA to form four conductive channel pairs E1, E2, E3, and E4 which are connected in series. As such, an end A and an end B of the signal transmission line 103 are always in an electrically connected state and signals may be normally transmitted between the end A and the end B, as long as the conductive channels I1 and I2 are not disconnected at the same time, the conductive channels I3 and I4 are not disconnected at the same time, the conductive channels I5 and I6 are not disconnected at the same time, and the conductive channels I7 and I8 are not disconnected at the same time, thereby greatly improving the reliability of bending of the display panel. In other words, in the case where the signal transmission line 103 and the corresponding auxiliary electrode 201 are connected to each other through the anisotropic conductive adhesive 3 as shown in FIG. 4, if neither the signal transmission line 103 nor the auxiliary electrode 201 is broken, parallel (or parallel-connected) conductive channels (or paths) exist between the end A and the end B. If, for example, four portions I2, I4, I6 and I8 of the auxiliary electrode 201 are all broken, both ends of the auxiliary electrode 201 can form a series-connected conductive channel with the signal transmission line 103 through the conductive particles 302. If, for example, only portion I2 of the auxiliary electrode 201 is broken, the left end of the auxiliary electrode 201 may form a series-connected conductive channel with the signal transmission line 103 through the conductive particles 302, a series-connected conductive channel is formed between the three conductive channel pairs E2, E3 and E4, and parallel (or parallel-connected) conductive channels are formed in each of the three conductive channel pairs E2, E3 and E4, therefore a combination of parallel-connected conductive channels and the series-connected conductive channel exists between the end A and the end B in this case.

The process of fixing the enhancement layer 2 to the bendable region 1b of the panel main body 1 by using the ACA is as follows. Firstly, the anisotropic conductive adhesive 3 is attached to each of the signal transmission lines 103 in the bendable region 1b. Then, the enhancement layer 2 is aligned with the bendable region 1b, and attached to a surface of the anisotropic conductive adhesive 3. Next, portions of the insulating colloid 301 at the upper and lower surfaces of the conductive particle 302 in the anisotropic conductive adhesive 3 are caused to be broken at a high-temperature and high-pressure environment, such that the upper surfaces of at least a part of the conductive particles 302 are connected to each auxiliary electrode 201 of the enhancement layer 2, and the lower surface of the at least a part of the conductive particles 302 are connected to the corresponding signal transmission line 103, thereby achieving electrical conduction in the vertical direction. In this way, each auxiliary electrode 201 and the corresponding signal transmission line 103 form parallel (or parallel-connected) conductive channels through the conductive particles 302.

As an exemplary embodiment, the number of the auxiliary electrodes 201 is equal to the number of the signal transmission lines 103 (i.e., the auxiliary electrodes 201 are in one-to-one correspondence with the signal transmission lines 103), and all of the auxiliary electrodes 201 are arranged in a first direction (e.g., a direction perpendicular to the cross section shown in FIG. 1). In this case, each signal transmission line 103 is provided with a corresponding auxiliary electrode 201, thereby greatly improving the reliability of bending of the display panel.

The inventors have found in practical applications that, since the panel main body 1 is generally thin, during a process in which a back film (e.g., a wiring film including the signal transmission lines 103) is attached to the panel main body 1, the bendable region 1b of the display panel is easily affected by a force, causing a size of the bendable region 1b along the first direction to be changed. When the enhancement layer 2 and the bendable region 1b are subsequently fixed together, since the auxiliary electrodes 201 of the enhancement layer 2 are close to each other and sensitive to the change in size, the change in size of the bendable region 1b may cause the signal transmission lines 103 in the bendable region 1b and the auxiliary electrodes 201 of the enhancement layer 2 to be misaligned with each other.

In order to address the above issue, in a technical solution of the present disclosure, arrangements of the signal transmission lines 103 and the auxiliary electrodes 201 are designed accordingly, which will be described in detail below with reference to the accompanying drawings. It should be noted that the following expression "length-direction virtual extension line" in the present disclosure is an unreal (i.e., virtual) extension line extending in a length direction of each auxiliary electrode 201 and/or the corresponding signal transmission line 103. In FIGS. 5a to 7c, the horizontal direction is a first direction X (e.g., the direction perpendicular to the cross section shown in FIG. 1), and the vertical direction perpendicular to the horizontal direction is a second direction Y (e.g., the horizontal direction in FIG. 1). Further, a virtual reference line L may also exist in the bendable region 1b, an extending direction of the reference line L is parallel to the second direction Y, and the reference line L passes through a center of the bendable region 1b.

Figure 5A:
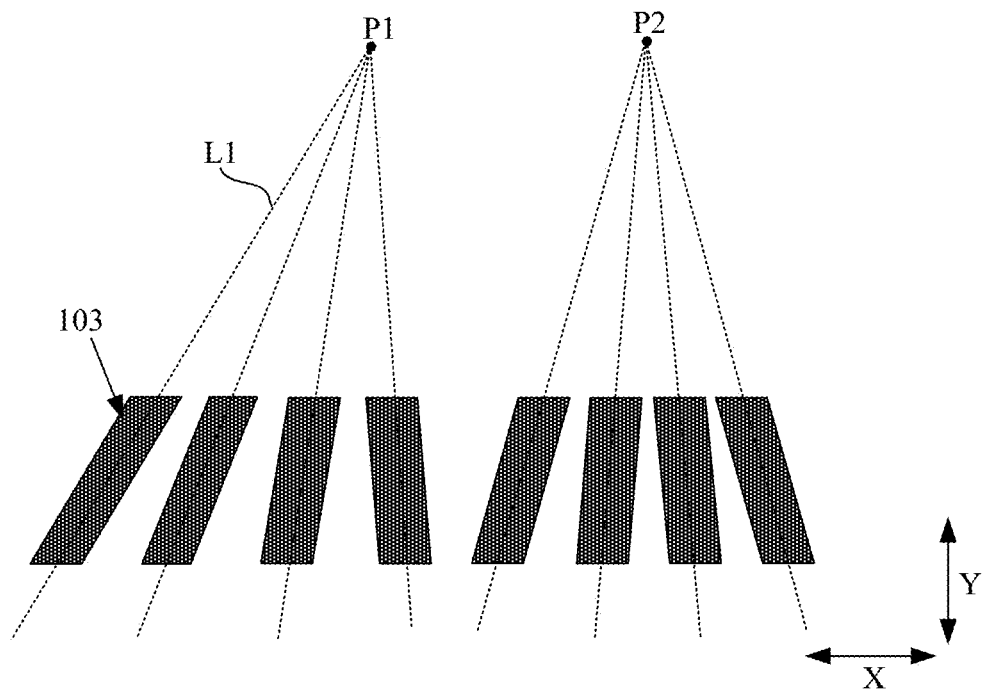
FIG. 5a is a schematic top view of signal transmission lines in a display panel according to an embodiment of the present disclosure.
Figure 5B:
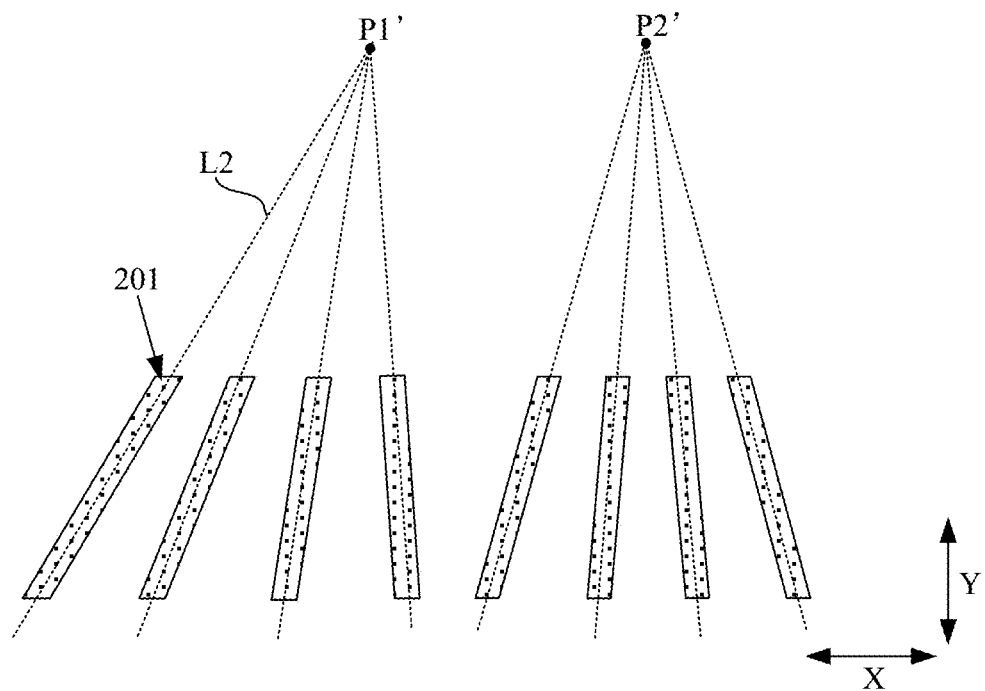
FIG. 5b is a schematic top view of auxiliary electrodes in a display panel according to an embodiment of the present disclosure.
Figure 5C:
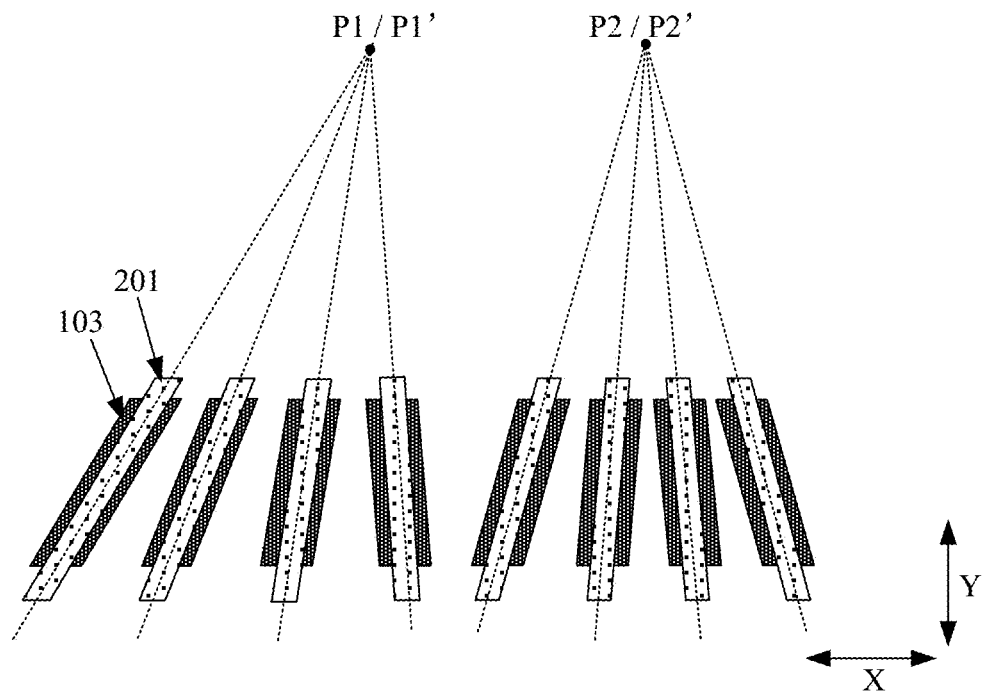
FIG. 5c is a schematic top view of the signal transmission lines shown in FIG. 5a and the auxiliary electrodes shown in FIG. 5b arranged corresponding to each other.

FIG. 5a is a schematic top view of the signal transmission lines 103 according to an embodiment of the present disclosure, FIG. 5b is a schematic top view of the auxiliary electrodes 201 according to the embodiment of the present disclosure, and FIG. 5c is a schematic top view showing that the signal transmission lines 103 shown in FIG. 5a are arranged corresponding to the auxiliary electrodes 201 shown in FIG. 5b, respectively. As shown in FIGS. 5a to 5c, for any one of the auxiliary electrodes 201, there is at least one other auxiliary electrode 201 whose length-direction virtual extension line L2 intersects with a length-direction virtual extension line L2 of the one auxiliary electrode 201. For any one of the signal transmission lines 103, there is at least one other signal transmission line 103 whose length-direction virtual extension line L1 intersects with a length-direction virtual extension line L1 of the one signal transmission line 103. For any one of the auxiliary electrodes 201, the length-direction virtual extension line L2 of the one auxiliary electrode 201 coincides with the length-direction virtual extension line L1 of the corresponding signal transmission line 103 (i.e., the signal transmission line 103 corresponding to the one auxiliary electrode 201).

Taking the cases shown in FIGS. 5a and 5b as an example, the length-direction virtual extension lines L1 of all of the signal transmission lines 103 may intersect at two different convergence points P1 and P2, respectively, and the length-direction virtual extension lines L2 of all of the auxiliary electrodes 201 may intersect at two different convergence points P1' and P2', respectively. The convergence point P1 and the convergence point P1' correspond to each other (e.g., coincide with each other in a direction perpendicular to the panel main body 1 shown in FIG. 1, as shown in FIG. 5c), and the convergence point P2 and the convergence point P2' correspond to each other (e.g., coincide with each other in the direction perpendicular to the panel main body 1 shown in FIG. 1, as shown in FIG. 5c).

In the present disclosure, when the size of the bendable region 1b is changed along the first direction X, a distance between any adjacent two of the signal transmission lines 103 in the bendable region 1b may be changed. For example, when the size of the bendable region 1b is increased along the first direction X, the distance between any adjacent two of the signal transmission lines 103 may be increased, and the convergence points P1 and P2 may move along the second direction Y. When the enhancement layer 2 is fixed to the bendable region 1b subsequently, By only adjusting a position of the enhancement layer 2 relative to the panel main body 1 in the second direction Y, the convergence point P1 may correspond to the convergence point P1', and the convergence point P2 may correspond to the convergence point P2', so as to achieve the alignment between each auxiliary electrode 201 and the corresponding signal transmission line 103. After an accurate alignment between each auxiliary electrode 201 and its corresponding signal transmission line 103 is completed, the enhancement layer 2 may be fixed to the bendable region 1b by a fixing process.

Based on the above, it can be seen that in the present disclosure, when the change in size of the bendable region 1b along the first direction X is in a certain range, the accurate alignment between each auxiliary electrode 201 and its corresponding signal transmission line 103 can be achieved by adjusting the position of the enhancement layer 2 relative to the signal transmission lines 103 in the second direction Y, thereby improving the accuracy of the position for arranging the enhancement layer 2 and the reliability of the display panel.

It should be noted that in the present disclosure, the number of the convergence points of the length-direction virtual extension lines of all of the signal transmission lines 103 is not limited to 2 (two) as shown in FIG. 5a, and may be smaller than or larger than 2 The number of the convergence points of the length-direction virtual extension lines of all of the auxiliary electrodes 201 is not limited to 2 (two) as shown in FIG. 5b, and may be smaller than or larger than 2.

Since a peripheral portion of the bendable region 1b is more likely to be changed in size (i.e., to deform) than a central portion of the bendable region 1b when the bendable region 1b is subjected to a force. When the signal transmission lines 103 are disposed on the panel main body 1 and the auxiliary electrodes 201 are disposed on the flexible substrate 202 of the enhancement layer 2, the signal transmission lines 103 and the auxiliary electrodes 201 may be disposed on the left and right sides of the reference line L as a central axis, to make an inclination angle, relative to the reference line L, of (e.g., the length-direction virtual extension line of) each signal transmission line 103 and the auxiliary electrode 201 corresponding to the signal transmission line 103 that are farther away from the reference line L is larger, which will be further described below.

Figure 6A:
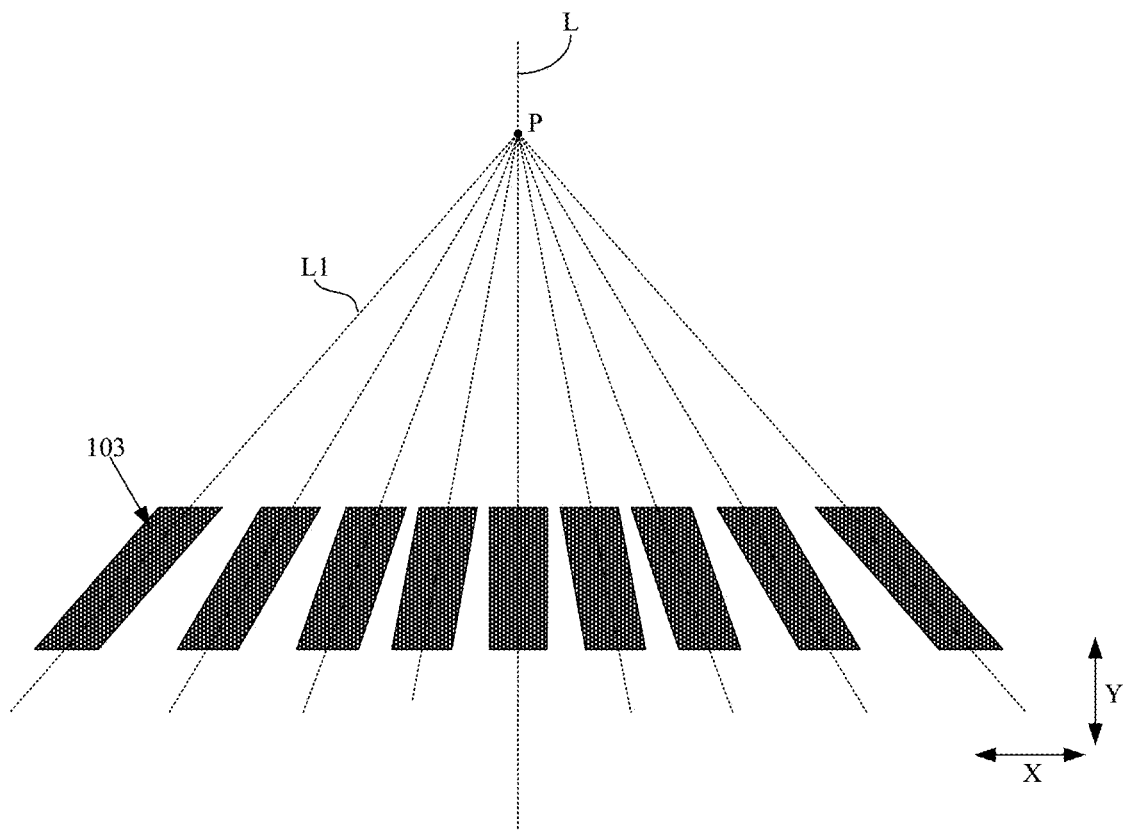
FIG. 6a is another schematic top view of signal transmission lines in a display panel according to an embodiment of the present disclosure.
Figure 6B:
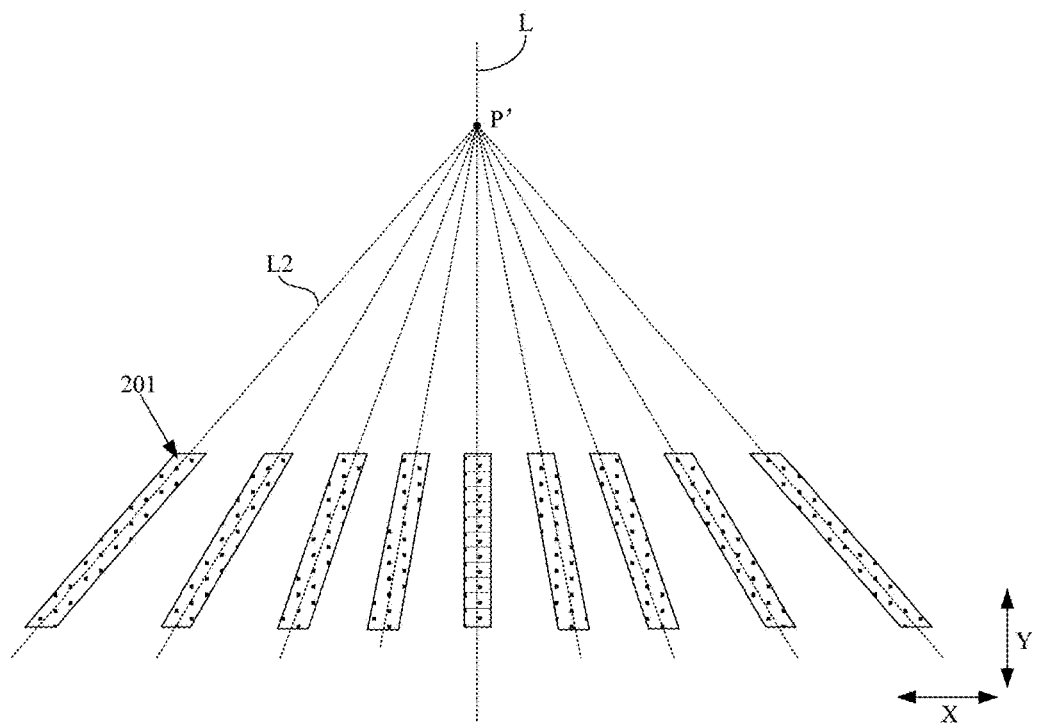
FIG. 6b is another schematic top view of auxiliary electrodes in a display panel according to an embodiment of the present disclosure.
Figure 6C:
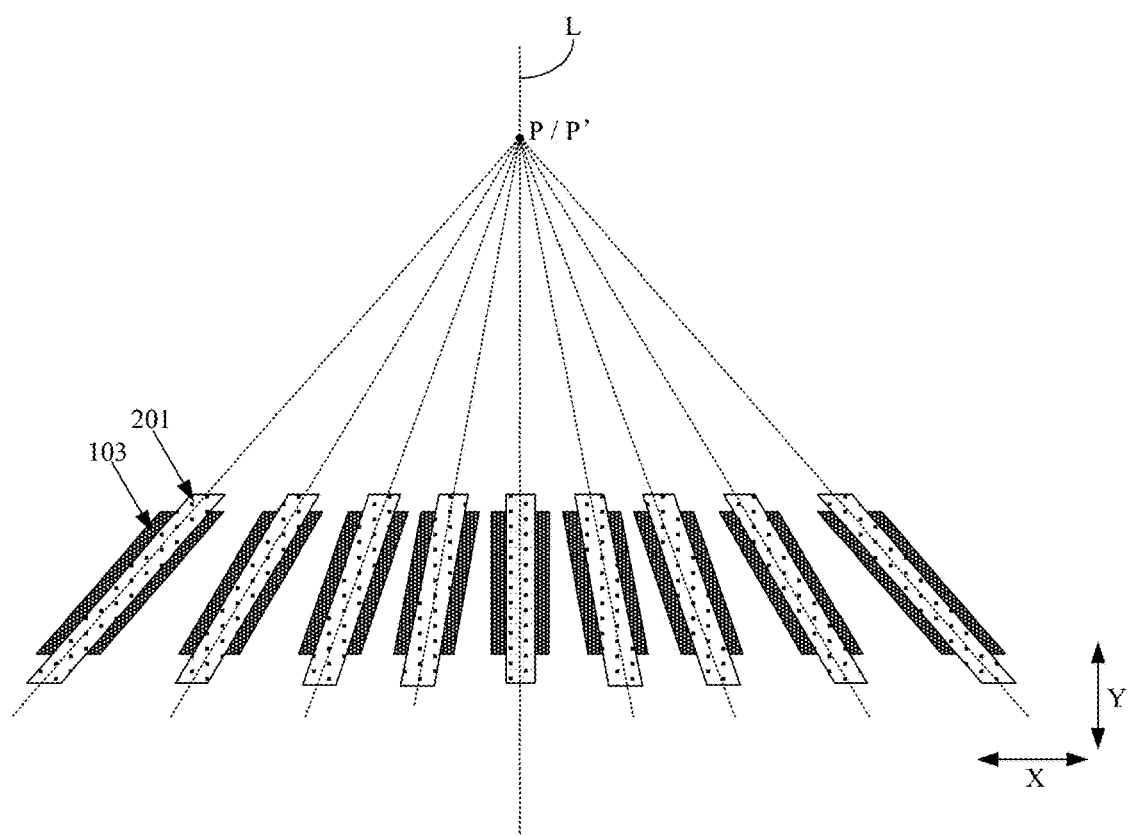
FIG. 6c is a schematic top view of the signal transmission lines shown in FIG. 6a and the auxiliary electrodes shown in FIG. 6b arranged corresponding to each other.

FIG. 6a is another schematic top view of the signal transmission lines 103 according to an embodiment of the present disclosure, FIG. 6b is another schematic top view of the auxiliary electrodes 201 according to the embodiment of the present disclosure, and FIG. 6c is a schematic top view showing that the signal transmission lines 103 shown in FIG. 6a and the auxiliary electrodes 201 shown in FIG. 6b are arranged corresponding to each other. As shown in FIGS. 6a to 6c, as an exemplary implementation, the length-direction virtual extension lines of the auxiliary electrodes 201 intersect at a same convergence point P' on the reference line (e.g., symmetry axis) L perpendicular to the first direction X. Among all of the auxiliary electrodes 201, an angle (e.g., the inclination angle) between the reference line L and the length-direction virtual extension line L2 of the auxiliary electrode 201 that is at a distance of zero from the reference line L (i.e., the auxiliary electrode 201 that overlaps the reference line L) may be zero degree, and the angle between the reference line L and the length-direction virtual extension line L2 of the auxiliary electrode 201 that is farther away from the reference line L is larger. The length-direction virtual extension lines L1 of the signal transmission lines 103 intersect at a same convergence point P on the reference line (e.g., the symmetry axis) L, and among all of the signal transmission lines 103, an angle (e.g., the inclination angle) angle between the length-direction virtual extension line L1 of the signal transmission line 103 that is at a distance of zero from the reference line L (i.e., the signal transmission line 103 that overlaps the reference line L) and the reference line L may be zero degree, and the angle between the reference line L and the length-direction virtual extension line L1 of the signal transmission line 103 that is farther away from the reference line L is larger. For example, the auxiliary electrodes 201 may be symmetrically distributed with respect to the reference line L, and the signal transmission lines 103 may be symmetrically distributed with respect to the reference line L.

In order to better solve the problem that the enhancement layer 2 and the bendable region 1b of the panel main body 1 are difficult to be accurately aligned with each other due to the fact that the deformation of the peripheral portion of the bendable region 1b of the panel main body 1 is greater than the deformation of the central portion of the bendable region 1b, an embodiment of the present disclosure further provide a design of sizes and arrangements of the auxiliary electrodes 201 and the signal transmission lines 103 as follows.

Figure 7A:
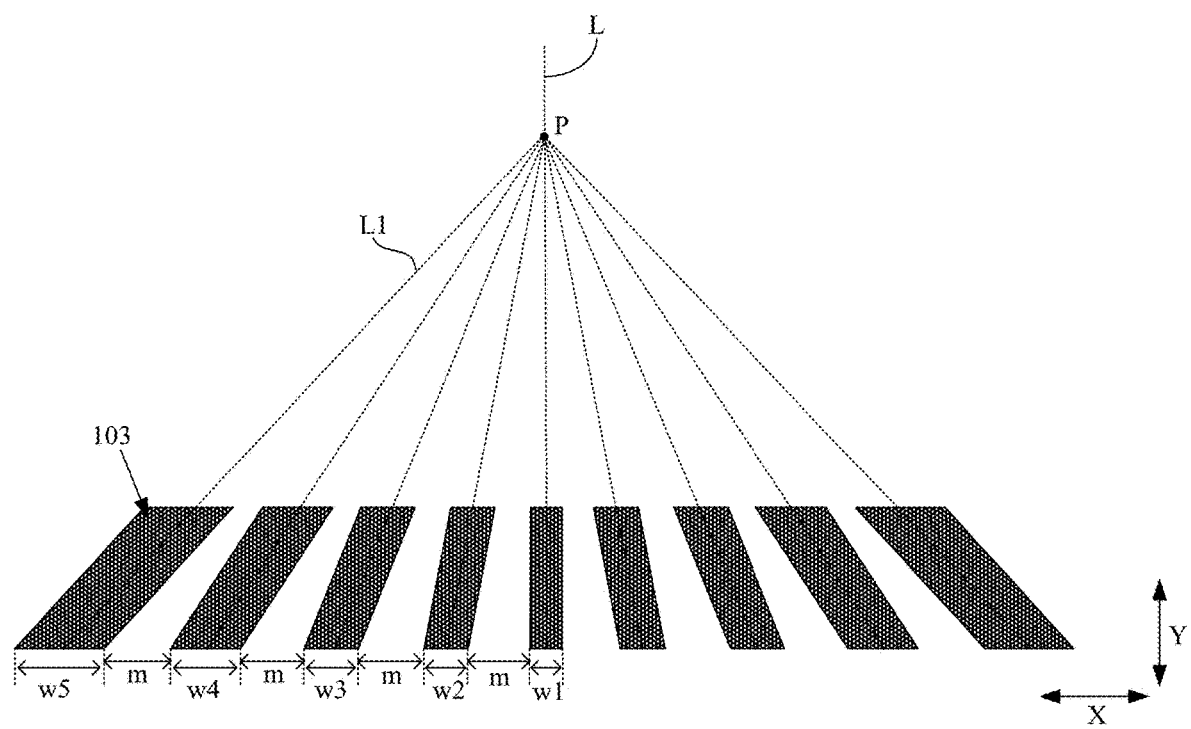
FIG. 7a is still another schematic top view of signal transmission lines in a display panel according to an embodiment of the present disclosure.
Figure 7B:
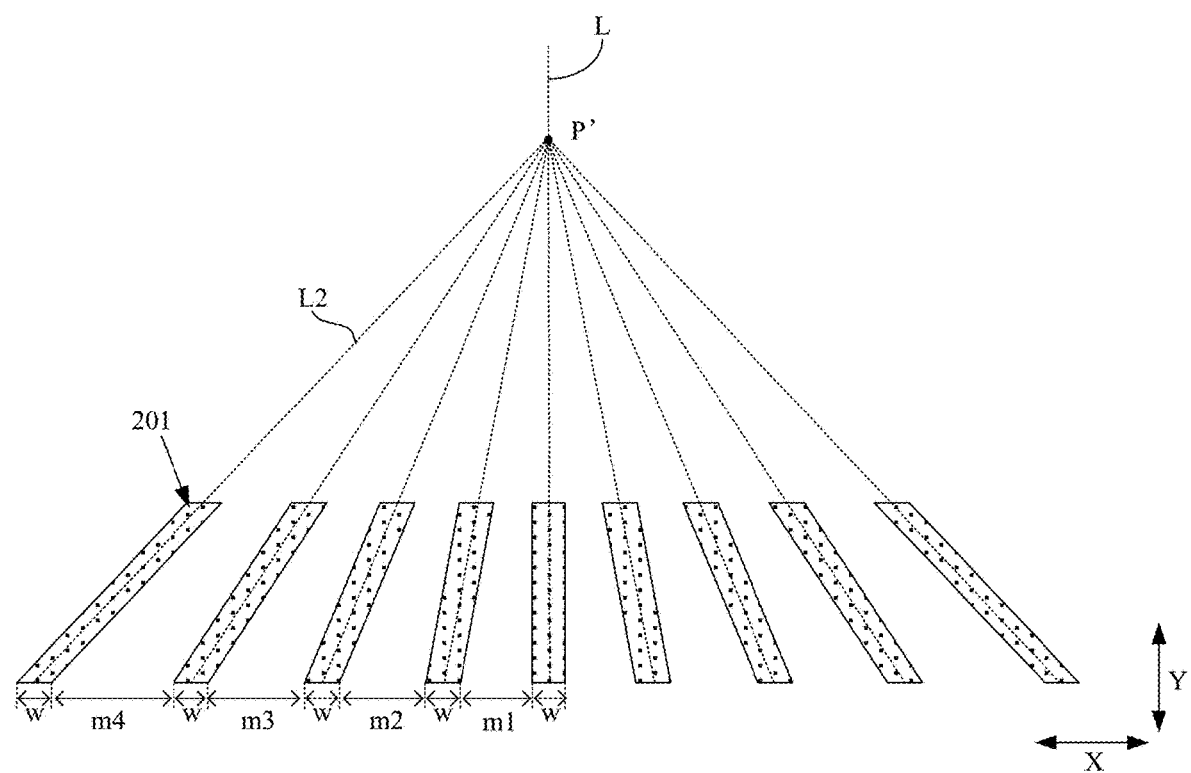
FIG. 7b is still another schematic top view of auxiliary electrodes in a display panel according to an embodiment of the present disclosure.
Figure 7C:
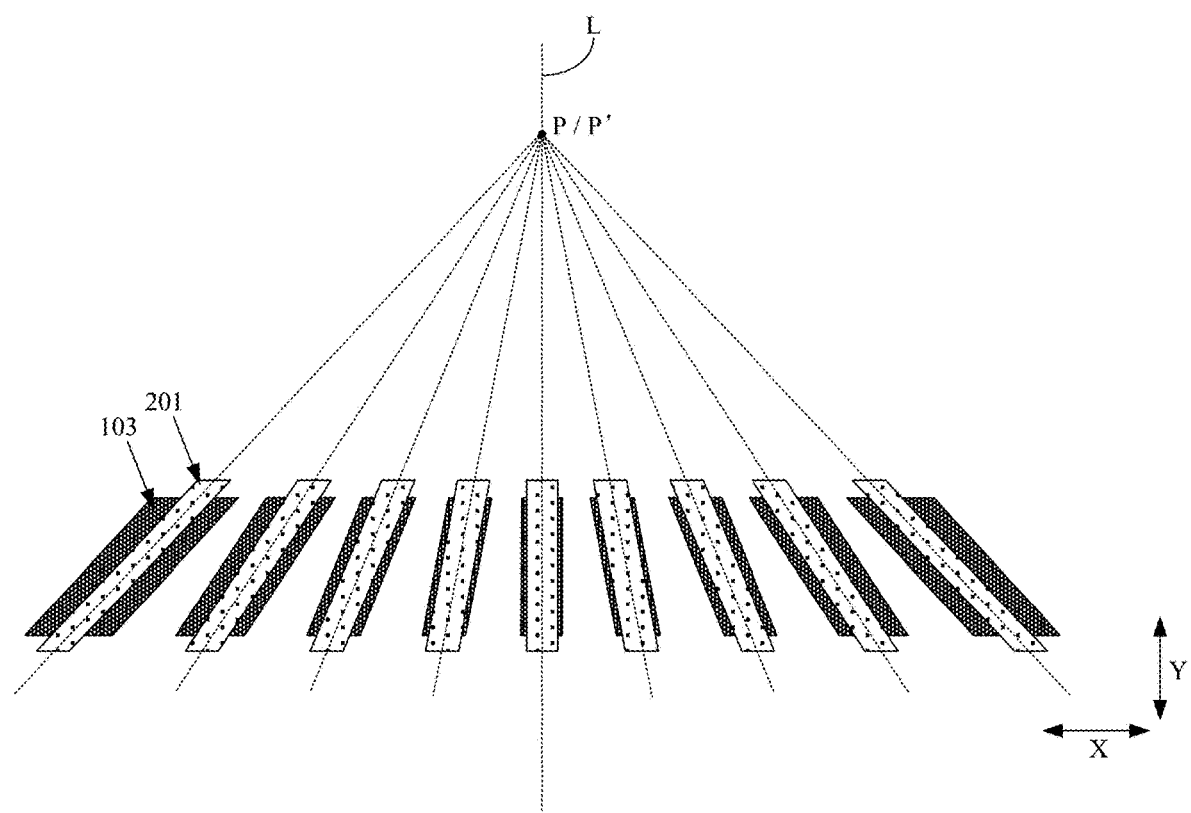
FIG. 7c is a schematic top view of the signal transmission lines shown in FIG. 7a and the auxiliary electrodes shown in FIG. 7b arranged corresponding to each other.

FIG. 7a is still another schematic top view of the signal transmission lines 103 according to an embodiment of the present disclosure, FIG. 7b is still another schematic top view of the auxiliary electrodes 201 according to the embodiment of the present disclosure, and FIG. 7c is a schematic top view showing that the signal transmission lines 103 shown in FIG. 7a and the auxiliary electrodes 201 shown in FIG. 7b are arranged corresponding to each other. As shown in FIGS. 7a to 7c, the auxiliary electrodes 201 have a same width w in the first direction X; and in a direction along the first direction X and away from the reference line L, maximal distances m1, m2, m3 and m4 in the first direction X between every adjacent two of the auxiliary electrodes 201 are gradually increased, i.e., m1<m2<m3<m4, as shown in FIG. 7b. Every adjacent two of the signal transmission lines 103 have a same maximal distance m in the first direction X, and in the direction along the first direction X and away from the reference line L, widths w1, w2, w3, w4 and w5 in the first direction X of the signal transmission lines 103 are gradually increased, i.e., w1<w2<w3<w4<w5, as shown in FIG. 7a. For example, the convergence point P of the length-direction virtual extension lines L1 of the signal transmission lines 103 and the convergence point P' of the length-direction virtual extension lines L2 of the auxiliary electrodes 201 coincide with each other in a stacking direction (e.g., the vertical direction in FIG. 1) of the plurality of signal transmission lines 103 and the enhancement layer 2. In addition, the reference line L of the signal transmission lines 103 in FIG. 7a and the reference line L of the auxiliary electrodes 201 in FIG. 7b coincide with each other in the stacking direction along which the enhancement layer 2 and the plurality of signal transmission lines 103 are stacked with each other. For example, in the first direction X, the width of each auxiliary electrode 201 may be smaller than the width of the signal transmission line 103 corresponding to the auxiliary electrode 201, so as to ensure that after the distance between any adjacent two of the signal transmission lines 103 is changed due to being subjected to a stress, the length-direction virtual extension line L2 of each auxiliary electrode 201 and the length-direction virtual extension line L1 of the signal transmission line 103 corresponding to the auxiliary electrode 201 may also coincide with each other in the stacking direction of the enhancement layer 2 and the plurality of signal transmission lines 103.

As described above, the panel main body 1 includes the base substrate 101 and the display function layer 102, and the display function layer 102 is located between the base substrate 101 and the enhancement layer 2. In addition, the display function layer 102 may include the pixel circuits and the organic light-emitting diodes sequentially disposed on the base substrate, and the pixel circuits may drive the organic light-emitting diodes to emit light to implement a display function of the display panel.

In an embodiment, as shown in FIG. 8, the display function layer 102 may include a water-oxygen barrier layer 102a, a gate insulating layer 102b, and an interlayer insulating layer 102c sequentially disposed on the base substrate 101, and a material of each of the water-oxygen barrier layer 102a, the gate insulating layer 102b, and the interlayer insulating layer 102c includes an inorganic material. The water-oxygen barrier layer 102a can prevent moisture and oxygen in an external environment from entering the inside of the display panel and corroding an Organic Light-emitting Diode (OLED) located inside the display panel. The gate insulating layer 102b may electrically isolate a gate electrode from an active layer of a thin film transistor in each of the pixel circuits. The interlayer insulating layer 102c may electrically isolate the gate electrode from a source electrode (and/or a drain electrode) of the thin film transistor.

In an embodiment, in the bendable region 1b, the inorganic material of each of the water-oxygen barrier layer 102a, the gate insulating layer 102b, and the interlayer insulating layer 102c of the display function layer 102 is removed to form a groove 102d, and the groove 102d is filled with an organic material 102e, as shown in FIG. 8. As such, the bendability and reliability of the bendable region 1b can be improved.

In an embodiment, the inorganic material of each of the water-oxygen barrier layer 102a, the gate insulating layer 102b, and the interlayer insulating layer 102c may include silicon nitride or silicon oxide, such that desired electrical isolation may be achieved. In addition, the organic material 102e may include photosensitive polyimide, which has good flexibility, good mechanical properties, and good photosensitivity, such that the organic material 102e is easily cured and has good bendability and reliability. Further, a material of the flexible substrate 202 of the enhancement layer 2 may include polyimide.

The embodiments of the present disclosure further provides a flexible display device including a display panel, which is the display panel according to any one of the foregoing embodiments, and details of the display panel may be referred to the foregoing contents and thus are omitted here. Further, the flexible display device may further include an Application Processor (AP) connected to the pad 4, a memory, etc. The AP may control the overall operation of the flexible display device, such as normal display. The memory may store relevant computer programs and data.

It should be understood that the above embodiments are merely exemplary embodiments adopted to illustrate the principles of the present disclosure, and the present disclosure is not limited thereto. It will be apparent to one of ordinary skill in the art that various changes and modifications may be made without departing from the scope of the present disclosure as defined by the appended claims, and such changes and modifications also fall within the scope of the present disclosure.

What is claimed is:

1. A display panel, comprising:
   a panel main body comprising a display region, a bendable region and a binding region, wherein a plurality of signal transmission lines extending from the display region to the binding region are arranged in the bendable region; and
   an enhancement layer in the bendable region of the panel main body and comprising an electrode layer, wherein the electrode layer comprises at least one auxiliary electrode, each auxiliary electrode corresponds to one of the plurality of signal transmission lines, different auxiliary electrodes correspond to different ones of the plurality of signal transmission lines, respectively, and each auxiliary electrode is electrically connected to a corresponding signal transmission line,
   wherein each auxiliary electrode is connected to the corresponding signal transmission line through an anisotropic conductive adhesive to form parallel conductive channels.

2. The display panel according to claim 1, wherein the enhancement layer further comprises a flexible substrate on a side of the electrode layer distal to the panel main body.

3. The display panel according to claim 1, wherein a number of the at least one auxiliary electrode is equal to a number of the plurality of signal transmission lines, and all of auxiliary electrodes are arranged in a first direction.

4. The display panel according to claim 3, wherein
   the enhancement layer is on a side of the plurality of signal transmission lines distal to the panel main body;
   for any one auxiliary electrode of the auxiliary electrodes, a length-direction virtual extension line of the any one auxiliary electrode intersects with a length-direction virtual extension line of at least one other auxiliary electrode;
   for any one signal transmission line of the plurality of signal transmission lines, a length-direction virtual extension line of the any one signal transmission line intersects with a length-direction virtual extension line of at least one other signal transmission line; and
   the length-direction virtual extension line of the any one auxiliary electrode coincides with the length-direction virtual extension line of the signal transmission line corresponding to the any one auxiliary electrode.

5. The display panel according to claim 4, wherein length-direction virtual extension lines of the auxiliary electrodes intersect at a same convergence point on a reference line perpendicular to the first direction;
   among all of the auxiliary electrodes, the farther the auxiliary electrode is from the reference line, the greater an angle between the length-direction virtual extension line of the auxiliary electrode and the reference line,
   length-direction virtual extension lines of the plurality of signal transmission lines intersect at a same convergence point on the reference line; and
   among all of the plurality of signal transmission lines, the farther the signal transmission line is from the reference line, the greater an angle between the length-direction virtual extension line of the signal transmission line and the reference line.

6. The display panel according to claim 5, wherein the auxiliary electrodes have a same width in the first direction; and maximal distances of every adjacent two of the auxiliary electrodes are gradually increased in a direction along the first direction and away from the reference line.

7. The display panel according to claim 5, wherein every adjacent two of the plurality of signal transmission lines have a same maximal distance therebetween in the first direction; and widths of the plurality of signal transmission line are gradually increased in a direction along the first direction and away from the reference line.

8. The display panel according to claim 7, wherein the auxiliary electrodes have a same width in the first direction; and maximal distances of every adjacent two of the auxiliary electrodes therebetween are gradually increased in a direction along the first direction and away from the reference line.

9. The display panel according to claim 8, wherein the convergence point of the length-direction virtual extension lines of the plurality of signal transmission lines and the convergence point of the length-direction virtual extension lines of the auxiliary electrodes coincide with each other in a stacking direction of the enhancement layer and the plurality of signal transmission lines.

10. The display panel according to claim 8, wherein in the first direction, the width of each auxiliary electrode is smaller than the width of the signal transmission line corresponding to the auxiliary electrode.

11. The display panel according to claim 5, wherein the auxiliary electrodes are symmetrically distributed with respect to the reference line; and the plurality of signal transmission lines are symmetrically distributed with respect to the reference line.

12. The display panel according to claim 1, wherein a material of each of the auxiliary electrodes comprises a metal.

13. The display panel according to claim 12, wherein each of the auxiliary electrodes is a single layer of molybdenum (Mo), a single layer of silver (Ag), a multilayer structure of Mo\aluminum (Al)\Mo, or a multilayer structure of titanium (Ti)\Al\Ti.

14. The display panel according to claim 1, wherein the panel main body comprises a base substrate and a display function layer, and the display function layer is between the base substrate and the enhancement layer.

15. The display panel according to claim 14, wherein the display function layer comprises a water-oxygen barrier layer, a gate insulating layer, and an interlayer insulating layer which are arranged on the substrate in sequence, and a material of each of the water-oxygen barrier layer, the gate insulating layer, and the interlayer insulating layer comprises an inorganic material.

16. The display panel according to claim 15, wherein the inorganic material of each of the water-oxygen barrier layer, the gate insulating layer, and the interlayer insulating layer of the display function layer in the bendable region is removed to form a groove, and the groove is filled with an organic material.

17. The display panel according to claim 16, wherein the inorganic material comprises silicon nitride or silicon oxide, and the organic material comprises photosensitive polyimide.

18. The display panel according to claim 2, wherein a material of the flexible substrate of the enhancement layer comprises polyimide.

19. A flexible display device, comprising the display panel according to claim 1.

* * * * *